United States Patent
Bayram et al.

(10) Patent No.: US 9,574,287 B2
(45) Date of Patent: Feb. 21, 2017

(54) GALLIUM NITRIDE MATERIAL AND DEVICE DEPOSITION ON GRAPHENE TERMINATED WAFER AND METHOD OF FORMING THE SAME

(71) Applicant: GLOBALFOUNDRIES INC., Grand Cayman (KY)

(72) Inventors: Can Bayram, Ossining, NY (US); Christos D. Dimitrakopoulos, Baldwin Place, NY (US); Keith E. Fogel, Hopewell Junction, NY (US); Jeehwan Kim, White Plains, NY (US); John A. Ott, Greenwood Lake, NY (US); Devendra K. Sadana, Pleasantville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 461 days.

(21) Appl. No.: 14/038,139

(22) Filed: Sep. 26, 2013

(65) Prior Publication Data
US 2015/0083036 A1    Mar. 26, 2015

(51) Int. Cl.
| | |
|---|---|
| C30B 25/00 | (2006.01) |
| C30B 25/18 | (2006.01) |
| C30B 29/40 | (2006.01) |
| H01L 21/02 | (2006.01) |
| H01L 29/16 | (2006.01) |
| H01L 33/00 | (2010.01) |
| H01L 33/32 | (2010.01) |

(Continued)

(52) U.S. Cl.
CPC .............. *C30B 25/18* (2013.01); *C30B 29/02* (2013.01); *C30B 29/406* (2013.01); *H01L 21/0254* (2013.01); *H01L 29/1606* (2013.01); *H01L 33/0025* (2013.01); *H01L 33/32* (2013.01); *C30B 25/183* (2013.01); *H01L 33/0079* (2013.01); *H01L 33/12* (2013.01)

(58) Field of Classification Search
CPC ........... H01L 33/0079; H01L 21/02444; H01L 21/0254; H01L 29/1606; C30B 25/183; C30B 29/406
See application file for complete search history.

(56) References Cited

U.S. PATENT DOCUMENTS

| | | |
|---|---|---|
| 5,214,306 A | 5/1993 | Hashimoto |
| 6,488,767 B1 | 12/2002 | Xu et al. |

(Continued)

OTHER PUBLICATIONS

Pirkle, A. et al. "In Situ Studies of Al2O3 and HFO2 Dielectrics on Graphite", Applied Physics Letters, vol. 95, No. 13. Sep. 2009. pp. 133106-133106-3.

*Primary Examiner* — Matthew Song
(74) *Attorney, Agent, or Firm* — Yuanmin Cai; Hoffman Warnick, LLC

(57) ABSTRACT

A method of forming an epitaxial semiconductor material that includes forming a graphene layer on a semiconductor and carbon containing substrate and depositing a metal containing monolayer on the graphene layer. An epitaxial layer of a gallium containing material is formed on the metal containing monolayer. A layered stack of the metal containing monolayer and the epitaxial layer of gallium containing material is cleaved from the graphene layer that is present on the semiconductor and carbon containing substrate.

20 Claims, 5 Drawing Sheets

(51) Int. Cl.
*C30B 29/02* (2006.01)
*H01L 33/12* (2010.01)

(56) References Cited

U.S. PATENT DOCUMENTS

| | | | |
|---|---|---|---|
| 6,508,879 B1 * | 1/2003 | Hashimoto | C30B 29/406 117/101 |
| 7,947,581 B2 | 5/2011 | Ma | |
| 2005/0103257 A1 * | 5/2005 | Xu | C30B 25/02 117/84 |
| 2007/0023775 A1 | 2/2007 | Jang | |
| 2007/0045654 A1 * | 3/2007 | Choi | H01L 33/007 257/103 |
| 2010/0060553 A1 | 3/2010 | Zimmerman et al. | |
| 2010/0301336 A1 | 12/2010 | Babich et al. | |
| 2010/0309943 A1 | 12/2010 | Chakraborty et al. | |
| 2010/0320445 A1 * | 12/2010 | Ogihara | H01L 21/02378 257/26 |
| 2011/0001163 A1 * | 1/2011 | Sasaki | H01L 33/007 257/103 |
| 2012/0141799 A1 | 6/2012 | Kub et al. | |
| 2012/0235119 A1 | 9/2012 | Babich et al. | |
| 2012/0318339 A1 | 12/2012 | Abou-Kandil et al. | |
| 2013/0017323 A1 | 1/2013 | Garces et al. | |
| 2013/0082241 A1 | 4/2013 | Kub et al. | |
| 2014/0255705 A1 * | 9/2014 | Nepal | C30B 25/186 428/446 |

\* cited by examiner

GALLIUM NITRIDE MATERIAL AND DEVICE DEPOSITION ON GRAPHENE TERMINATED WAFER AND METHOD OF FORMING THE SAME

BACKGROUND

Technical Field

The present disclosure relates to semiconductor devices, such as light emitting diodes (LEDs). The present disclosure further relates to processing of materials suitable for use in LED containing structures.

Description of the Related Art

Light emitting diodes (LEDs) are well-known semiconductor devices that convert electrical current into light. The color (wavelength) of the light that is emitted by an LED depends on the semiconductor material that is used to fabricate the LED. This is because the wavelength of the emitted light depends on the semiconductor material's bandgap, which represents the energy difference between the material's valence band and conduction band electrons. Gallium-Nitride (GaN) has gained much attention from LED researchers. One reason for this is that GaN can be combined with indium to produce InGaN/GaN semiconductor layers that emit red, green, blue, and white light. This wavelength control ability enables an LED semiconductor designer to tailor material characteristics to achieve beneficial device characteristics. For example, GaN enables an LED semiconductor designer to produce blue LEDs, which are beneficial in optical recordings, and white LEDs, which can replace incandescent and halogen lamps. Despite the rapid development of GaN device technology, GaN devices can be too expensive for many applications. One reason for the high cost of manufacturing GaN-based devices is the difficulties of growing GaN epitaxial layers and of subsequently dicing out completed GaN-based devices. GaN-based devices are typically fabricated on sapphire substrates. Sapphire is an expensive material that increases the cost of LED manufacture.

SUMMARY

In one aspect, the methods and structures disclosed herein provide a method of forming a substrate material for LED applications. In one embodiment, the methods disclosed herein provide a method for forming an epitaxial gallium nitride containing layer for LED applications that can be formed on a reusable substrate composed of a graphene layer that is present on a semiconductor and carbon containing substrate. The method for forming the epitaxial semiconductor material may include forming a graphene layer on a semiconductor and carbon containing substrate, and depositing a metal containing monolayer on the graphene layer. An epitaxial layer of a gallium containing material may be formed on the metal containing monolayer. The layered stack of the metal containing monolayer and the epitaxial layer of gallium containing material may be cleaved from the graphene layer that is present on the semiconductor and carbon containing substrate.

In another aspect of the present disclosure, a layer transfer method is provided for forming at least one semiconductor material, wherein the material stack is suitable for use in an LED structure. In one embodiment, the method for forming the semiconductor material may include forming a first epitaxial layer of a first gallium containing material on a graphene layer that is present on a semiconductor and carbon containing substrate. A transfer substrate may then be bonded to a surface of the first epitaxial layer of the first gallium containing material that is opposite a surface of the first epitaxial layer of the first gallium containing material that is present on the semiconductor and carbon containing substrate. A mechanical force may be applied to the transfer substrate in a direction away from the graphene layer to cleave the first epitaxial layer of the first gallium containing material from a stack of the graphene layer and the semiconductor and carbon containing substrate. The transfer substrate may be removed from the first epitaxial layer of the first gallium containing layer. A device substrate may be bonded to the first epitaxial layer of the first gallium containing layer. A second epitaxial layer of a second gallium containing material may then be formed on the first epitaxial layer of the first gallium containing material.

In another aspect, an LED structure is provided. The LED structure may include a first contact containing at least one first metal containing layer that is in contact with at least one first gallium containing material layer having a first conductivity type. An intrinsic semiconductor material layer is in contact with the at least one first gallium containing material layer having the first conductivity type. At least one second gallium containing material layer having a second conductivity type is in contact with the intrinsic material layer. A second contact containing at least one second metal containing layer may be in contact with a surface of the at least one second gallium containing material layer that is opposite a surface of the at least one second gallium containing material that is in direct contact with the intrinsic semiconductor material layer. At least one of the at least one first gallium containing material layer and the at least one second gallium containing layer has a stepped surface.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
FIG. 1 is a side cross-sectional view depicting one embodiment of a graphene layer on a semiconductor and carbon containing substrate, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide type III-nitride material systems, such as gallium nitride. Type III-nitride materials are crystalline materials in which a first lattice position of the crystal structure is occupied by an element from group IIIA of the periodic table of elements under the Chemical Abstracts Service (CAS) naming convention (which is referred to as Group 13 under the International Union of Pure and Applied Chemistry naming convention), and nitrogen occupies a second lattice position in the crystal structure. Some examples of type III-nitride materials suitable for the methods and structures disclosed herein include gallium nitride, indium nitride, gallium indium nitride, aluminum indium gallium nitride and combinations thereof.

Some advantageous properties of type III-nitride materials is that they can be characterized as having a direct bandgap across the entire range of tunability for light emitting devices, such as LEDs. In some examples, the material having a direct bandgap is a material in which the top of the valence band and the bottom of the conduction band for the band gap of the material occur at the same value of momentum. This typically provides that the electrons of the material having a direct band gap may emit a photon, which can make them suitable for light emitting applications, such as LEDs. For, example, the direct band gap of aluminum nitride (AlN) may be on the order of approximately 6 eV, while the direct band gap of indium nitride (InN) may be on the order of approximately 0.5 eV.

Type III-nitride material systems, such as GaN, may have a wurtzite crystal structure. Wurtzite is the hexagonal analog of the zincblende lattice. In the case of GaN, the crystal structure is an arrangement of interpenetrating layers of Ga and N atoms in which each atom is tetragonally connected with four atoms of the opposite species. The unit cell has a basis of four atoms with lattice constants a=3:189 Å in the basal plane and c=5:185 Å normal to the basal plane. The direct bandgap energy of gallium nitride is 3.4 eV at 300K.

Type III-nitride materials are also characterized as having a low intrinsic carrier density, a low leakage and low dark current. Type III-nitride materials are also characterized as having a high thermal conductivity, high breakdown voltage, as well as strong piezoelectric effects. In view of the above performance characteristic, applications for type III-nitride materials disclosed herein, include but are not limited to, light emitting diodes (LEDs); bio-agent elimination, such as water purification and sanitation; secure communications applications, such as devices for satellite to satellite communications; and defense applications, such as devices for terrestrial and aerial countermeasures.

Some difficulties with forming devices composed of type III-nitride materials is their cost of manufacture. For example, sapphire substrates typically provide the deposition surface for the epitaxial formation of type III-nitride materials, such as gallium nitride. Sapphire substrates, i.e., substrates composed of $Al_2O_3$, are costly and are limited in size. Typically, the cost of sapphire substrate is a major contributor to the cost of a final device, such as an LED, including type III-nitride materials, such as GaN. Other difficulties that have been observed with device structures, such as LEDs, including type III-nitride materials, such as GaN, is that the contacts to these devices are typically formed on one side of the device on the same surface. This side-to-side contact allocation can result in current crowding effects that degrade carrier injection. Further, sapphire substrates have a particularly low thermal conductivity on the order of 42 W/m-k. In comparison, the thermal conductivity of silicon is 150 W/m-k, the thermal conductivity of gallium nitride is 130 W/m-k, and the thermal conductivity of silicon carbide is 490 W/m-k. In some examples, the low thermal conductivity of sapphire results in higher junction temperatures in devices formed including sapphire substrates, which can degrade the electrical performance of the device, as well as the lifetime of the device.

In some embodiments, the methods and structures disclosed herein provide an alternative to sapphire substrates for forming type III-nitride materials. For example, the methods disclosed herein can utilize a silicon carbide substrate that is reusable as the deposition surface for the epitaxial formation of type III-nitride materials. Further, the methods and structures disclosed herein can provide layered device structures, such as LEDs, in which the contacts to the device are provided on opposing surfaces, e.g., opposing upper and lower surfaces, of the device structure. In some embodiments, LED devices having a top and bottom contact allocation enable increased current carrier injection and increased electrical performance when compared to LED devices having a side-by-side contact allocation that is present on a single surface of the device structure. The top and bottom contact allocation provides for a vertical LED orientation, as opposed to a lateral LED orientation that results from a side-by-side contact allocation. Further, by eliminating the low thermal conductivity sapphire substrate, in some embodiments, the methods and structures that are disclosed herein enable a more thermally conductive submount, such as a submount composed of silicon carbide or aluminum nitride. Further, in some embodiments, light extraction techniques, such as surface roughening or photonic crystal employment, can be easily implemented in the disclosed methods once the submount, e.g., silicon carbide submount, for forming the type III-nitride material, e.g., gallium nitride, is removed. Light extraction techniques are facilitated by the disclosed methods, because type III-nitride materials have a lower hardness than sapphire, which allows for easier patterning of the type III-nitride materials. The methods and structures of the present disclosure are now described in more detail with reference to FIGS. 1-13.

FIGS. 1-6 depict one embodiment of a method for epitaxially forming type III-nitride materials. "Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the deposition surface with sufficient energy to move around on the surface and orient themselves to the crystal arrangement of the atoms of the deposition surface. For example, a epitaxial material that is deposited on a crystalline surface will also have a crystalline structure.

FIG. 1 depicts one embodiment of a layered substrate structure for epitaxially forming type III-nitride semiconductor materials that includes a graphene layer 10 on a semiconductor and carbon containing substrate 5. In one embodiment, the semiconductor and carbon containing substrate 5 is silicon carbide (SiC). In some embodiments, a semiconductor and carbon containing substrate 5 of silicon carbide (SiC) could include 2H—SiC, 4H—SiC, 6H—SiC or combinations thereof. In one example, the semiconductor and carbon containing substrate is composed of 4H—SiC. The thickness of the semiconductor and carbon containing substrate 5 may range from 10 μm to 1000 μm. In another embodiment, the thickness of the semiconductor and carbon containing substrate 5 may range from 300 μm to 600 μm.

In some embodiments, the graphene layer 10 is present on an upper surface of the semiconductor and carbon containing substrate 5. Graphene, as used for the material of the graphene layer 10, may be substantially an sp2 bonded carbon layer that is a two dimensional honeycomb crystal lattice layer or sheet with a carbon-carbon bond length of about 0.142 nm, where sheets may be stacked with an interplanar spacing of about 0.335 nm, and may be stacked in certain arrangements such as A-B ordering. In some embodiments, because graphene is a two dimensional material, the forces between stacked layers is weak, and may be provided by Van der Waals forces.

In one embodiment, the graphene layer 10 has a thickness of 3.0 nm or less. In another embodiment, the graphene layer 10 has a thickness ranging from 0.3 nm to 3.0 nm. In some embodiments, the graphene layer 10 may be a single sheet of carbon atoms forming a substantially two dimensional honeycomb crystal lattice over the upper surface of the semiconductor and carbon containing substrate 5. The graphene layer 10 is substantially an sp2 bonded carbon layer but can have some fraction of carbon atoms with sp3 bonds. The graphene layer 10 can also be thin graphite material such as graphene nanoplatelets. In some embodiments, the graphene layer 10 can be nanocarbon structures or nanographene structures with substantially sp2 bonding.

The graphene layer 10 in certain embodiments can be composed of sheets that are non-planar, and result in an upper surface being stepped. The upper surface of the graphene layer 10 that is opposite the surface of the graphene layer 10 that is in direct contact with the semiconductor and carbon containing substrate 5 can have a high surface roughness. The graphene layer 10, for example, can be rippled, or wavy, or corrugated, or have ridges. One approach to form non-planar graphene sheet material on the surface of semiconductor and carbon containing substrate 5 is by microwave plasma enhanced chemical vapor deposition (PECVD).

Some examples of processes for forming the graphene layer 10 on the semiconductor and carbon containing substrate 5 are by epitaxial growth of the graphene layer 10 on the semiconductor and carbon containing substrate 5; by chemical vapor deposition (CVD) growth of the graphene layer 10 on a metal film, or on a metal foil that is present on the semiconductor and carbon containing substrate 5; and by growth of a graphene layer 10 on a transfer substrate and then transferring and bonding of the graphene layer 10 to the semiconductor and carbon containing substrate 5. In some embodiments, the graphene layer 10 can be formed by epitaxial growth of graphene material on the surface of a silicon carbide (SiC) substrate. In one example, the graphene layer 10 can be formed on the surface of a SiC substrate by epitaxial growth at temperatures in the range of 1100° C. to 2000° C. The graphene layer 10 can be grown on a metal surface, such as copper, nickel, iron, iridium (and other metals) surfaces by chemical vapor deposition (CVD) growth using methane, or by exposing the surface of the material to carbon containing molecules. A graphene layer 10 can also be formed on semiconductor and carbon containing substrate 5 of silicon carbide (SiC) by sublimation, solution growth or a combination thereof.

The graphene layer 10 can be formed by the transfer and bonding of one or more sheets of graphene that are grown on the surface of a second substrate (not shown). In the transfer and bond approach, in a first step, a graphene material composed of one or more sheets of graphene are first grown on a metal layer on a dielectric substrate or semiconductor substrate, or on a metal foil substrate of copper, nickel or other metal using CVD. In one example of the transfer and bond approach, in a second step, a heat releasable tape is adhered to the top surface of the graphene material that is formed on the substrate, and in a third step the heat releasable tape is lifted from the surface of the substrate with graphene material attached to the bottom surface of the heat releasable tape. The graphene material that is attached to the heat releasable tape may provide the graphene layer 10. The surface of the semiconductor and carbon containing substrate 5 to receive the graphene sheet or sheets, i.e., graphene layer 10, is suitably prepared for direct bonding of the graphene layer 10. The process of preparing the surface of the semiconductor and carbon containing substrate 5 may include appropriate cleaning, and in some cases by appropriate treatment for improving the bond strength of the graphene layer 10 to the surface of the semiconductor and carbon containing substrate 10. In a fourth step, the surface of the graphene layer 10 may then be brought into direct contact with the surface of the semiconductor and carbon containing substrate 5 and the bonding forces present between the surface of the graphene layer 10 and the material of the semiconductor and carbon containing substrate 5, such as Van der Waals bonding forces, will bond the graphene layer 10 to the semiconductor and carbon containing substrate 5. The bond strength of the graphene layer 10 to the substrate material can be improved by appropriately charging the surface of the semiconductor and carbon containing substrate 5 and/or the graphene layer 10 by exposing the surfaces to a plasma or a corona treatment. The bond strength of the graphene layer 10 to the surface of the semiconductor and carbon containing substrate 5 can in some cases also be improved by forming hydroxyl ions HO— on the surface of the semiconductor and carbon containing substrate 5. Once the graphene layer 10 is bonded to the semiconductor and carbon containing substrate 5, the heat releasable tape can be removed.

Figure 2:
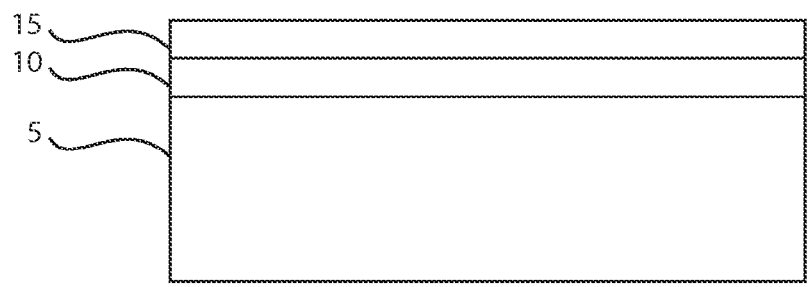
FIG. 2 is a side cross-sectional view depicting depositing a metal containing monolayer on the graphene layer, in accordance with one embodiment of the present disclosure.

FIG. 2 depicts one embodiment of depositing a metal containing monolayer 15 on the graphene layer 10. The term "monolayer" means substantially a single layer of elemental material, such as elemental aluminum, on a deposition surface. By "substantially a single layer" it is meant that the monolayer may include 1 to 10 monolayers. For example, in some embodiments, the metal containing monolayer may include 1 to 3 monolayers. In another example, the metal containing monolayer 15 may be 1 to 5 monolayers. In yet another example, the metal containing monolayer 15 may be one monolayer. In some embodiments, the metal containing monolayer 15 has a thickness of 0.5 nm to 5 nm. In another embodiment, the metal containing monolayer 15 has a thickness ranging from 1 nm to 3 nm.

The metal containing monolayer 15 may be composed of aluminum, copper, silver, gold, platinum, tungsten, nickel and combinations thereof. In one embodiment, the metal containing monolayer 15 may be composed of greater than 90 at. % aluminum. In another embodiment, the metal containing monolayer 15 may comprise greater than 95 at. % aluminum. In yet another embodiment, the metal containing monolayer 15 may be composed of greater than 99 at. % aluminum. In one example, the metal containing monolayer 15 may be 100 at. % aluminum. Incidental impurities that can be present in a metal containing layer monolayer that is composed of aluminum include silicon, hydrogen, carbon, nitrogen, oxygen and combinations thereof.

In one embodiment, the metal containing monolayer 15 can be formed using a chemical vapor deposition (CVD) method, such as metal organic CVD (MOCVD). Chemical vapor deposition (CVD) is a deposition process in which a deposited species is formed as a result of chemical reaction between gaseous reactants at greater than room temperature (e.g., 25° C. to 900° C.), wherein solid product of the reaction is deposited on the surface on which a film, coating, or layer of the solid product is to be formed.

In one example, prior to forming the metal containing monolayer 15, the stack of the semiconductor and carbon containing substrate 5 and the graphene layer 10 is positioned within the deposition chamber of the CVD apparatus, e.g., MOCVD apparatus, and the stack of the semiconductor and carbon containing substrate 5 and the graphene layer is baked, i.e., annealed, under an inert carrier gas, such as $H_2$, $N_2$, Ar or a combination thereof, at a temperature ranging from 700° C. to 1400° C., for a time period ranging from 5 minutes to 25 minutes. In one embodiment, the baking step applied to the stack of the semiconductor and carbon containing substrate 5 and the graphene layer 10 includes a temperature ranging from 900° C. to 1200° C., for a time period ranging from 10 minutes to 20 minutes. In yet another embodiment, the baking step applied to the stack of the semiconductor and carbon containing substrate 5 and the graphene layer 10 includes a temperature of 1100° C., for a time period of 15 minutes.

In one embodiment, depositing the metal containing monolayer 15 includes applying an aluminum containing source gas, also referred to as aluminum containing CVD precursor, to the upper surface, i.e., deposition surface, of the graphene layer 10 while the stack of the semiconductor and carbon containing substrate 5 and the graphene layer 10 is present in the deposition chamber of the CVD apparatus, such as an MOCVD apparatus. In some embodiments, the aluminum containing source gas selected from the group consisting of trimethylaluminum (TMAl), aluminum chloride ($AlCl_3$), aluminum isopropoxide ($Al(OPr)_3$), $Al(OSiEt_3)_3$ and combinations thereof. The deposition temperature for forming a metal containing monolayer 15 of aluminum may range from 600° C. to 1200° C. The deposition temperature is measured at the deposition surface. In one embodiment, the time period for flowing the aluminum containing source gas to the upper surface, i.e., deposition surface, of the graphene layer 10 ranges from 10 second to 150 seconds. In another embodiment, the time period for flowing the aluminum containing source gas to the upper surface, i.e., deposition surface, of the graphene layer 10 ranges from 15 seconds to 150 seconds. In one example, the metal containing monolayer 15 is deposited using MOCVD with a source gas of trimethylaluminum (TMAl) at a deposition temperature of 800° C. for a time period of 60 seconds. Other variations of CVD processes that are suitable for depositing the metal containing monolayer 15 besides MOCVD include, but are not limited to, Atmospheric Pressure CVD (APCVD), Low Pressure CVD (LPCVD) and Plasma Enhanced CVD (PECVD) and combinations thereof.

Figure 3:
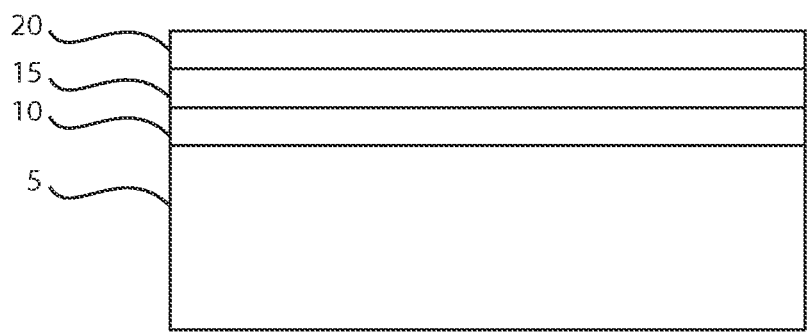
FIG. 3 is a side cross-sectional view depicting one embodiment of forming a buffer layer composed of at least one of gallium, metal, indium, and nitrogen, in accordance with the present disclosure.

FIG. 3 depicts one embodiment of forming a buffer layer 20 composed of a type I II-nitride material including at least one of gallium, aluminum, indium, and nitrogen. The buffer layer 20 is typically formed on the metal containing monolayer 15 using a CVD method, such as MOCVD. In some embodiments of an MOCVD process for forming the buffer layer 20, the film is deposited through a chemical reaction occurring between metal organic precursors and hydrides on a hot deposition surface of the stack of the metal containing monolayer 15, the graphene layer 10 and the semiconductor and carbon containing substrate 5. In some embodiments, the deposition surface of the stack of the metal containing monolayer 15, the graphene layer 10 and the semiconductor and carbon containing substrate 5 is heated to a temperature, i.e., deposition temperature, ranging from 650° C. to 950° C. for deposition of the buffer layer 20. In another embodiment, the deposition temperature for depositing the buffer layer 20 of type III-nitride material ranges from 700° C. to 900° C.

In the case of aluminum indium gallium nitride (AlIn)GaN crystal growth for forming the buffer layer 20, at least one of trimethylgallium (Ga(CH$_3$)$_3$)(TMGa), trimethylaluminum (C$_3$H$_9$Al)(TMAl), and trimethylindium ((CH$_3$)$_3$In)(TMIn) can be used as group III gas precursors, while ammonia gas (NH$_3$) is used as a nitrogen source. For example, gallium nitride (GaN) can be grown by introducing TMGa and NH$_3$ simultaneously into the reaction chamber with a deposition surface heated to temperatures ranging from 800° C. to 1,000° C. Ternary compounds, such as aluminum, gallium and nitride containing layers, e.g., AlGaN, and indium gallium nitride containing layers, e.g., InGaN, for the buffer layer 20 can be obtained by blending source gasses of TMAl or TMIn simultaneously with a source gas of TMGa. The solid composition of the deposited epitaxial buffer layer 20 may be controlled by adjusting the gas-phase composition of the TMAl and TMGa or the TMIn and TMGa.

In one embodiment, the buffer layer 20 is composed of Al$_x$Ga$_y$In$_{(1-x-y)}$N that is formed using a gas source composed of least one of trimethylgallium (Ga(CH$_3$)$_3$)(TMGa), trimethylaluminum (C$_3$H$_9$Al)(TMAl), and trimethylindium ((CH$_3$)$_3$In)(TMIn) and ammonia (NH$_3$), with a carrier gas composed of nitrogen (N$_2$), in which the deposition temperature may range from 700° C. to 900° C. In one example, the deposition temperature for forming the buffer layer 20 of Al$_x$Ga$_y$In$_{(1-x-y)}$N is 700° C. In another embodiment, the buffer layer 20 is composed of aluminum nitride (AlN) that is formed using a gas source composed of least one of trimethyaluminum (C$_3$H$_9$Al)(TMAl) and ammonia (NH$_3$), with a carrier gas composed of nitrogen (N$_2$), in which the deposition temperature may range from 700° C. to 900° C. In one example, the deposition temperature for forming the buffer layer 20 of aluminum nitride is 900° C. In yet another embodiment, the buffer layer 20 is composed of aluminum gallium nitride (Al$_x$Ga$_{(1-x)}$N) that is formed using a gas source composed of least one of trimethyaluminum (C$_3$H$_9$Al)(TMAl), trimethylgallium (Ga(CH$_3$)$_3$)(TMGa) and ammonia (NH$_3$), with a carrier gas composed of nitrogen (N$_2$), in which the deposition temperature may range from 700° C. to 900° C. In one example, the deposition temperature for forming the buffer layer 20 of aluminum gallium nitride (Al$_x$Ga$_{(1-x)}$N) is 900° C. The buffer layer 20 may be a single layer having one of the above described compositions, or may be a multilayered structure of multiple compositions. Further, the present disclosure is not limited to the above described type III-nitride compositions, because any type III-nitride material is suitable for use as the material of the buffer layer 20. In yet another embodiment, the buffer layer 20 may be composed of a single layer of gallium nitride (GaN).

In one example, the buffer layer 20 is composed of a single composition layer that is 100% gallium nitride (GaN). In some examples, when the buffer layer 20 is composed of indium gallium nitride, the elements that occupy the type III crystal position of the type III-nitride material is gallium and indium. Gallium occupies 75% of the type III crystal positions in the crystal lattice and indium occupies 25% of the type III crystal positions in the crystal lattice. When the buffer layer 20 is composed of indium gallium nitride, the element that occupies the type V crystal position of the type III-nitride material is nitrogen, wherein nitrogen occupies 100% of the type V crystal positions in the crystal lattice. In some embodiments, when the buffer layer 20 is composed of aluminum gallium indium nitride (Al$_x$Ga$_y$In$_{(1-x-y)}$N), the elements that occupy the type III crystal position of the type III-nitride material are aluminum, gallium and indium. For example, aluminum occupies 25% of the type III crystal positions in the crystal lattice, gallium occupies 75% of the type III crystal positions in the crystal lattice and indium occupies 25% of the type III crystal positions in the crystal lattice. When the epitaxial buffer layer 20 is composed of aluminum gallium indium nitride, the element that occupies the type V crystal position of the type III-nitride material is nitrogen, wherein nitrogen occupies 100% of the type V crystal positions in the crystal lattice. In some embodiments, the buffer layer 20 has a thickness ranging from 2 nm to 500 nm. In yet another embodiment, the buffer layer 20 has a thickness ranging from 30 nm to 200 nm.

In some embodiments, the buffer layer 20 may be a nanocrystalline material, a microcrystalline material, a polycrystalline material, or a single crystalline material. The term "crystalline" includes nanocrystalline, polycrystalline or microcrystalline. The term "single crystalline" denotes a crystalline solid, in which the crystal lattice of the entire sample is substantially continuous and substantially unbroken to the edges of the sample, with substantially no grain boundaries. In another embodiment, the crystalline semiconductor material of the absorption layer is of a multi-crystalline or polycrystalline structure. Contrary to a single crystal crystalline structure, a polycrystalline structure is a form of semiconductor material made up of randomly oriented crystallites and containing large-angle grain boundaries, twin boundaries or both. Multi-crystalline is widely referred to a polycrystalline material with large grains (of the order of millimeters to centimeters). Other terms used are large-grain polycrystalline, or large-grain multi-crystalline. The term polycrystalline typically refers to small grains (hundreds of nanometers, to hundreds of microns). The buffer layer 20 may have a cubic or wurtzite crystal structure.

In some embodiments, the buffer layer 20 is typically processed to have a n-type or p-type conductivity for use in a semiconductor device, such as an LED. For example, gallium nitride as used in one embodiment of the buffer layer 20, can be doped with silicon (Si) or with oxygen (O) to provide an n-type conductivity. In another example, gallium nitride can be doped with magnesium (Mg) to a p-type conductivity. The buffer layer 20 may be doped using in-situ doping or ion implantation. In some embodiments, the concentration of n-type dopant in the buffer layer 20 may range from $10^{17}$ atoms/cm$^3$ to $10^{21}$ atoms/cm$^3$. In another embodiment, the concentration of n-type dopant in the buffer layer 20 may range from $10^{18}$ atoms/cm$^3$ to $10^{20}$ atoms/cm$^3$. In some embodiments, the concentration of p-type dopant in the epitaxial gallium nitride layer 25 may range from $10^{17}$ atoms/cm$^3$ to $10^{21}$ atoms/cm$^3$. In another embodiment, the concentration of p-type dopant in the buffer layer 20 may range from $10^{18}$ atoms/cm$^3$ to $10^{20}$ atoms/cm$^3$.

The buffer layer 20 typically functions as a seed layer for the subsequently deposited epitaxial gallium nitride layer 25 that is depicted being formed in FIG. 4. In this embodiment, an epitaxial layer of a gallium containing material including both the buffer layer 20 and epitaxial gallium nitride layer 25 is transferred from the stack of the graphene layer 10 and the semiconductor and carbon containing substrate 5 during a subsequently described layer transfer process. In some embodiments, both the buffer layer 20 and the epitaxial gallium nitride layer 25 are composed of the same material, such as gallium nitride.

Figure 4:
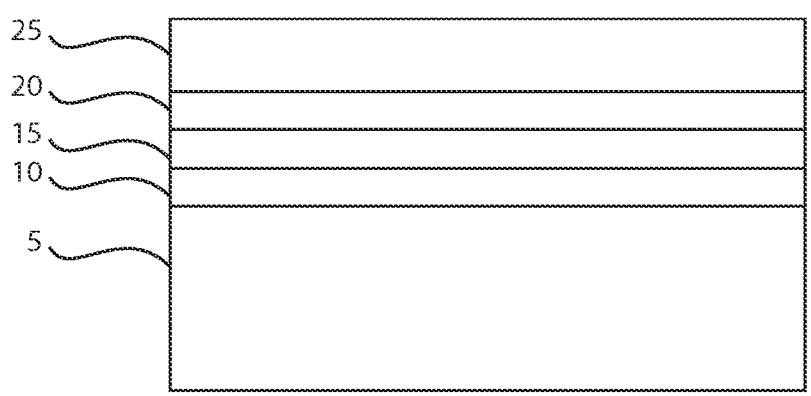
FIG. 4 is a side cross-sectional view depicting one embodiment of forming an epitaxial gallium nitride layer on the buffer layer, in accordance with the present disclosure.

FIG. 4 depicts one embodiment of forming an epitaxial gallium nitride layer 25 on the buffer layer 20. In some embodiments, the epitaxial layer of the gallium containing material includes both the epitaxial gallium nitride layer 25 and the buffer layer 20. In one embodiment, the epitaxial gallium nitride layer 25 is composed substantially entirely of gallium nitride, e.g., 100% gallium nitride. The epitaxial gallium nitride layer 25 may be formed using a CVD method, such as MOCVD. The deposition method for forming the epitaxial gallium nitride layer 25 is similar to the deposition method for forming the buffer layer 20. The gas sources for forming the epitaxial gallium nitride layer 25 can include trimethylgallium ($Ga(CH_3)_3$)TMGa) and ammonia ($NH_3$), with a carrier gas composed of nitrogen ($N_2$), in which the deposition temperature may range from 700° C. to 900° C. In one embodiment, the deposition temperature for forming the epitaxial gallium nitride layer 25 is greater than the deposition temperature for forming the buffer layer 20. For example, the deposition temperature for the epitaxial gallium nitride layer 25 may range from 900° C. to 1300° C. In another example, the deposition temperature for the epitaxial gallium nitride layer 25 may range from 1000° C. to 1200° C. Typically, increasing the temperature to greater than 900° C. provides an epitaxial gallium nitride layer 25 having a wurtzite crystal structure, wherein at deposition temperatures less than 900° C., the deposited epitaxial gallium nitride layer 25 may have a cubic crystal structure.

The thickness of the epitaxial gallium nitride layer 25 may range from 200 nm to 5000 nm. In another embodiment, the thickness of the epitaxial gallium nitride layer 25 may range from 750 nm to 1500 nm. In one example, the epitaxial gallium nitride layer 25 may have a thickness of 2000 nm.

The epitaxial gallium nitride layer 25 is typically processed to have an n-type or p-type conductivity for use in a semiconductor device, such as an LED. For example, gallium nitride as used in the epitaxial gallium nitride layer 25 can be doped with silicon (Si) or with oxygen to provide an n-type conductivity. In another example, gallium nitride can be doped with magnesium (Mg) to a p-type conductivity. The epitaxial gallium nitride layer 25 may be doped using in-situ doping or ion implantation. In some embodiments, the concentration of n-type dopant in the epitaxial gallium nitride layer 25 may range from $10^{17}$ atoms/cm$^3$ to $10^{21}$ atoms/cm$^3$. In another embodiment, the concentration of n-type dopant in the epitaxial gallium nitride layer 25 may range from $10^{18}$ atoms/cm$^3$ to $10^{20}$ atoms/cm$^3$. In some embodiments, the concentration of p-type dopant in the epitaxial gallium nitride layer 25 may range from $10^{17}$ atoms/cm$^3$ to $10^{21}$ atoms/cm$^3$. In another embodiment, the concentration of p-type dopant in the epitaxial gallium nitride layer 25 may range from $10^{18}$ atoms/cm$^3$ to $10^{20}$ atoms/cm$^3$. In some examples, undoped gallium nitride can be n-type, because incidental impurities of the deposited gallium nitride (GaN) with silicon or oxygen that result from the deposition process for forming gallium nitride may act as donors.

In some embodiments, the upper surface of the epitaxial gallium nitride layer 25 is planar. In some embodiments, the planar upper surface of the epitaxial gallium nitride layer 25 has a roughness of 10 Å or less in an area of 25 µm$^2$. In one embodiment, the planar upper surface of the epitaxial gallium nitride layer 25 has a roughness that ranges from 1 Å to 10 Å in an area of 25 µm$^2$. In one example, the planar upper surface of the gallium nitride layer 25 has a roughness that is on the order of 3 Å in an area of 25 µm$^2$.

Figure 5:
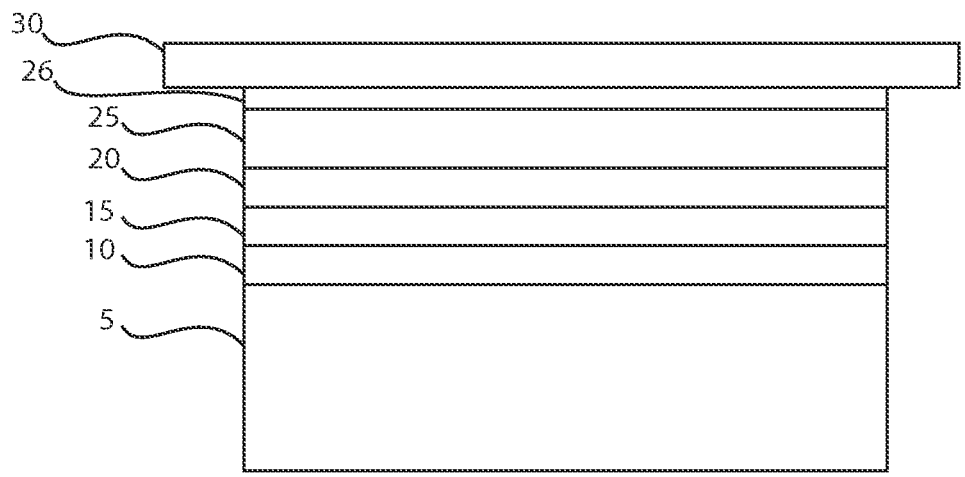
FIG. 5 is a side cross-sectional view depicting applying a transfer substrate to a surface of the epitaxial gallium nitride layer, in accordance with one embodiment of the present disclosure.

FIG. 5 depicts one embodiment of applying a transfer substrate 30 to a surface of the epitaxial layer of a gallium containing material, i.e., the epitaxial gallium nitride layer 25. In some embodiments, a stressor layer 26 is formed in direct contact with the epitaxial gallium nitride layer 25 before the transfer substrate 30 is formed on the surface of the epitaxial layer of gallium containing material. In this example, the stressor layer 26 is present between and in direct contact with the transfer substrate 30 and the epitaxial gallium nitride layer 25. The stressor layer 26 that can be employed in the present disclosure includes any material that is under tensile or compressive stress. As such, the stressor layer 26 can also be referred to herein as a stress-inducing layer. Illustrative examples of materials that are under tensile stress when applied atop the epitaxial gallium nitride layer 25 and thus can be used as the stressor layer 26 include, but are not limited to, a metal, a polymer, or any combination thereof. The stressor layer 26 may comprise a single stressor material, or multiple stressor materials. In one embodiment, the stressor layer 26 is a metal. When a metal is employed as the stressor layer 26, the metal can include, e.g., Ni, Cr, Fe, and/or W. Alloys of these metals can also be employed. In one embodiment, the stressor layer 26 includes at least one layer consisting of Ni. The stressor layer 26 may also be a polymer. When a polymer is employed as the stressor layer 26, the polymer is a large macromolecule composed of repeating structural units. These subunits are typically connected by covalent chemical bonds. Illustrative examples of polymers that can be employed as the stressor layer 26 include, but are not limited to, polyimides polyesters, polyolefins, polyacrylates, polyurethane, polyvinyl acetate, and polyvinyl chloride. It is noted that the above referenced materials are provided for illustrative purposes only, and are not intended to limit the present disclosure, as any material suitable for exfoliation processes is suitable for use as the stressor layer 26.

The transfer substrate 30 may be applied to the stressor layer 26. In some embodiments, the transfer substrate 30 may be a spall inducing tape layer that can include any pressure sensitive tape that is flexible. By "pressure sensitive tape," it is meant an adhesive tape that will stick with application of pressure, without the need for solvent, heat, or water for activation. Typically, the pressure sensitive tape that can be employed in the present disclosure includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added. Some examples of tapes that can be used in the present disclosure as the transfer substrate 30 include, for example, Nitto Denko 3193MS thermal release tape, Kapton KPT-1, and Diversified Biotech's CLEAR-170 (acrylic adhesive, vinyl base).

Figure 6:
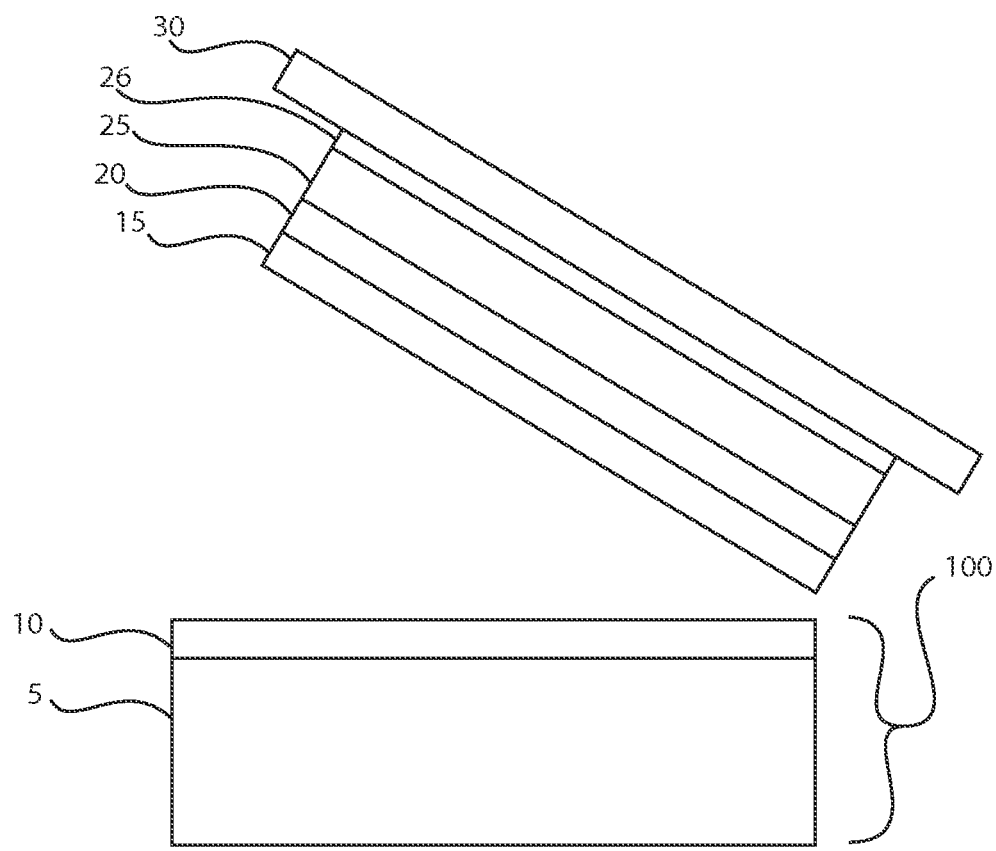
FIG. 6 is a side cross-sectional view depicting one embodiment of cleaving of the layered stack of the metal containing monolayer and the epitaxial layer of gallium containing material from the graphene layer by applying a mechanical force to the transfer substrate in a direction away from an interface between the metal containing monolayer and the graphene layer.

FIG. 6 depicts one embodiment of cleaving the layered stack of the metal containing monolayer 15 and the epitaxial layer of gallium containing material, e.g., the epitaxial gallium nitride layer 25, the stressor layer 26 and the buffer layer 20, from the graphene layer 10 by applying a mechanical force to the transfer substrate 30 in a direction away from an interface between the metal containing monolayer 15 and the graphene layer 10. By "cleaving" it is meant that the epitaxial gallium nitride layer 25, the buffer layer 20 and the metal containing layer 15 are separated from the graphene layer 10. The mechanical force may be applied to the transfer surface by pulling the transfer substrate 30 in a direct away from an interface between the metal containing monolayer 15 and the graphene layer 10. In some embodiments, the structure cleaves at the interface between the metal containing monolayer 15 and the graphene layer 10, because of the two dimensional bonding character of the graphene layer 10. The two dimensional bonding of the graphene layer 10 includes chemical bonding in the x-direction (length) and z-direction (width) for each graphene sheet that provides the graphene layer 10. The graphene layer 10 includes multiple, i.e., at least two, graphene layers that are stacked. The forces connecting the adjacent graphene layers in the stack of graphene layers (forces in the y-direction (height)) are orders of magnitude weaker than the chemical bonds of the graphene layer 10 in the x-direction and y-direction that provide the two dimensional bonding. The forces bonding the adjacent stacked graphene layers (forces in the y-direction (height)) of the graphene layer 10 may be Van der Waals bonding. Applying a force to the graphene layer 10 through the transfer substrate 30 overcomes the weak forces bonding the adjacent stacked graphene layers cleaving the graphene layer 10.

Following cleaving of the layered stack of the metal containing monolayer 15 and the epitaxial layer of gallium containing material, e.g., the epitaxial gallium nitride layer 25 and the buffer layer 20, from the graphene layer 10 to transfer the epitaxial layer of gallium containing material to the stressor layer 26 and the transfer substrate 30, the remaining portion 100 of the graphene layer 10 and the semiconductor and carbon containing substrate 5 that is not connected to the transfer substrate 30 may be reused. For example, the remaining portion 100 of the graphene layer 10 and the semiconductor and carbon containing substrate 5 may be reused as a growth substrate 100 to form another gallium containing nitride layer in accordance with the above described method referring to FIGS. 1-6.

In some embodiments, the surface of the metal containing monolayer 15 and the buffer layer 20 that is cleaved from the graphene layer 10 is not planar. More specifically, the surface of the surface of the metal containing layer 15 and the buffer layer 20 can be stepped. The stepped surface of the metal containing layer 15 and the buffer layer 20 results from being formed on the surface of the graphene layer 10, which is characterized as being rippled, or wavy, or corrugated, or having ridges. The stepped surface may have a roughness that is greater than 4 Å in an area of 25 $\mu m^2$. In another embodiment, stepped surface may have a roughness that ranges from 4 Å to 20 Å in an area of 25 $\mu m^2$. In one example, the stepped surface may have a roughness of 5 Å in an area of 25 $\mu m^2$. The stepped surface may also be formed on epitaxial layers that are formed on the buffer layer 20, such as the epitaxial gallium nitride containing layer 25.

Figure 7:
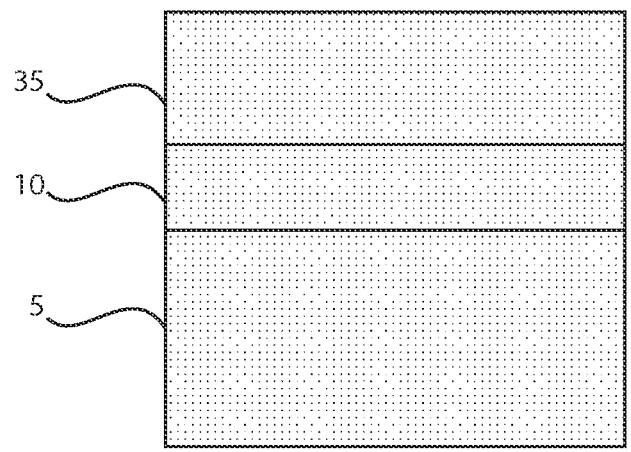
FIG. 7 is a side cross-sectional view depicting forming at least one first epitaxial layer of at least one first gallium containing material on a graphene layer that is present on a semiconductor and carbon containing substrate as used in a method for forming an epitaxial gallium nitride layer, in accordance with one embodiment of the present disclosure.

FIGS. 7-11 depict one embodiment of a layer transfer method for forming a low defect density gallium containing material, e.g., epitaxial gallium nitride layer, which is suitable for use in semiconductor devices, such as LED structures. The term "low defect density" denotes a semiconductor material, e.g., gallium containing material, having a defect density of <5E10/$cm^2$ or less. FIG. 7 depicts forming the material stack including at least one first epitaxial layer 35 of a first gallium containing material on a graphene layer 10 that is present on a semiconductor and carbon containing substrate 5. In one embodiment, the at least one first epitaxial layer 35 of the first gallium containing material includes an metal containing monolayer that is in direct contact with the graphene layer, a buffer layer that is in contact with the metal containing monolayer, and an epitaxial gallium nitride layer that is in contact with the metal containing monolayer. The description of the metal containing monolayer 15, the buffer layer 20 and the epitaxial gallium containing layer 25 that are depicted in FIGS. 1-4, is suitable for the description of the metal containing layer, the buffer layer, and the epitaxial gallium nitride layer that may be incorporated within the at least one first epitaxial layer 35 depicted in FIG. 7.

Figure 8:
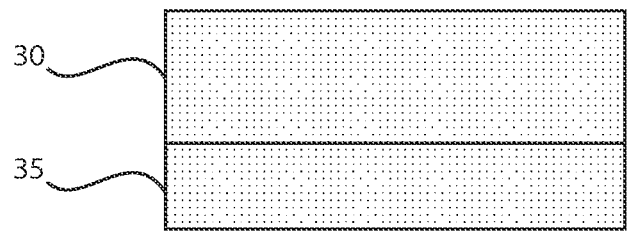
FIG. 8 is a side cross-sectional view depicting bonding a transfer substrate to a surface of the at least one first epitaxial layer of the at least one first gallium containing material, and applying a mechanical force to the transfer substrate in a direction away from the graphene layer to cleave the at least one first epitaxial layer from the stack of the graphene layer and the semiconductor and carbon containing substrate, in accordance with one embodiment of the present disclosure.

FIG. 8 depicts one embodiment of a transfer substrate 30 being bonded to a surface of the first epitaxial layer 35 of the first gallium containing material that is opposite a surface of the first epitaxial layer 35 of the first gallium containing material that is present on the semiconductor and carbon containing substrate 5. The transfer substrate 30 that is depicted in FIG. 8 has been described above with reference to FIG. 5.

Referring to FIG. 8, a mechanical force may be applied to the transfer substrate 30 in a direction away from the graphene layer to cleave the first epitaxial layer 35 of the first gallium containing material from a stack of the graphene layer and the semiconductor and carbon containing substrate. The description of cleaving the layered stack of the metal containing monolayer 15 and the epitaxial layer of gallium containing material, e.g., the epitaxial gallium nitride layer 25 and the buffer layer 20, from the graphene layer 10 depicted in FIG. 6 is suitable for the description of cleaving the first epitaxial layer 35 from the graphene layer and the semiconductor and carbon containing substrate that is depicted in FIG. 8.

In some embodiments, a remaining portion of the graphene layer that is present on the metal containing monolayer after cleaving is removed by an oxygen plasma. A "plasma" is any gas in which a percentage of the atoms or molecules are ionized. In some embodiments, the degree of ionization may vary from $10^{-4}$ to as high as 5-10%. In some examples, the plasma employed for removing the remaining portion of the graphene layer is created by RF (AC) frequency or DC discharge between two electrodes of a CVD apparatus.

Figure 9:
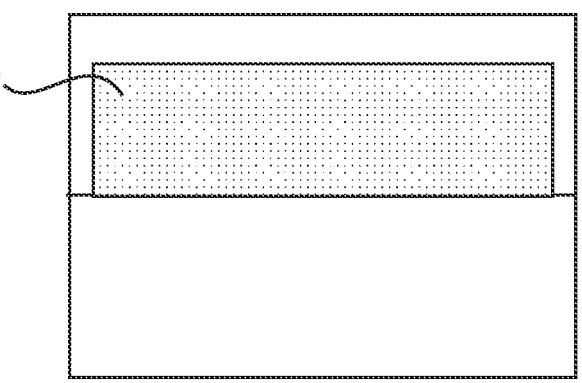
FIG. 9 is a side cross-sectional view depicting removing the transfer substrate from the first epitaxial layer of the first gallium containing material.

FIG. 9 depicts removing the transfer substrate from the first epitaxial layer 35 of the first gallium containing layer. For example, and in one embodiment, the transfer substrate may be removed by an aqua regia ($HNO_3$/HCl) wet chemistry. In another example, UV or heat treatment is used to remove the transfer substrate. In yet another embodiment, an organic solvent, such as acetone, to remove the transfer substrate.

Figure 10:
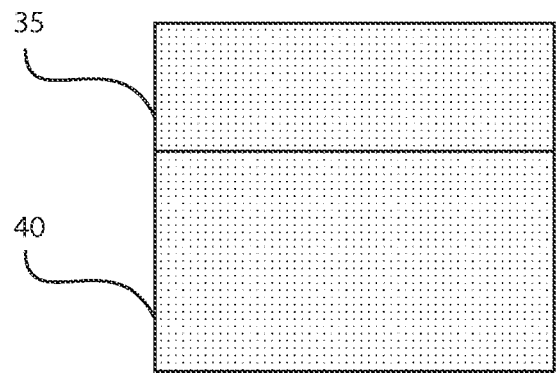
FIG. 10 is a side cross-sectional view depicting bonding a device substrate to the first epitaxial layer of the first gallium containing material, in accordance with one embodiment of the present disclosure.

FIG. 10 depicts one embodiment of a device substrate 40 being bonded to the first epitaxial layer 35 of the first gallium containing material. The device substrate 40 may be composed of a silicon containing material. In one embodiment, the device substrate 40 is silicon carbide (SiC). In some embodiments, a device substrate 40 composed of silicon carbide (SiC) may include 2H—SiC, 4H—SiC, 6H—SiC or combinations thereof. In one example, the device substrate 40 is composed of 4H—SiC. The thickness of the device substrate 40 may range from 100 µm to 1000 µm. In another embodiment, the thickness of the device substrate 40 may range from 300 µm to 500 µm. In some embodiments, the device substrate 40 may be joined with the first epitaxial layer 35 by wafer bonding. For example, the device substrate 40 and the first epitaxial layer 35 may be bonded to one another by contacting the device substrate 40 to the first epitaxial layer 35 and annealing. Annealing can promote direct atomic bonding between the device substrate 40 and the first epitaxial layer 35. For example, annealing for bonding the device substrate 40 to the first epitaxial layer 35 can be performed by heating the contacted surfaces to a temperature of greater than about 700° C. For example, annealing can be performed at 800° C. for 2 hours. It is noted that the above noted materials for the device substrate 40 are provided for illustrative purposes only, and are not intended to limit the present disclosure. For example, the device substrate 40 may also be composed of sapphire.

Figure 11:
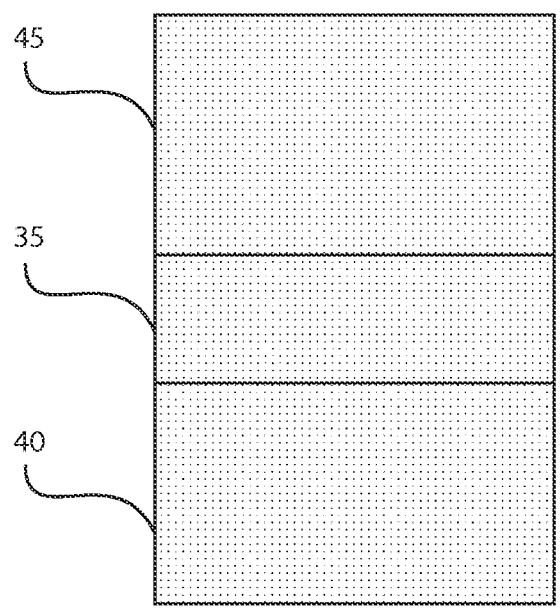
FIG. 11 is a side cross-sectional view depicting one embodiment of forming a second epitaxial layer of a second gallium containing material on the at least one first epitaxial layer, in accordance with the present disclosure.

FIG. 11 depicts one embodiment of forming a second epitaxial layer 45 of a second gallium containing material on the at least one first epitaxial layer 35 of the at least one first gallium containing material. The second epitaxial layer 45 of the second gallium containing material may be gallium nitride, but it is not intended that the second epitaxial layer 45 of the second gallium containing layer be limited to only this composition. For example, the second gallium containing material 45 may be any type III-nitride semiconductor material that has been described above for the epitaxial gallium nitride layer 25 that is depicted in FIG. 4. The second epitaxial layer 45 may be formed using the methods that are described for forming the epitaxial gallium nitride layer 25 that is depicted in FIG. 4. In the embodiments in which the first epitaxial layer 35 has a wurtzite crystalline, the second epitaxial layer 45 of the second gallium containing material may also have a wurtzite crystal structure.

Typically, the second epitaxial layer 45 of the second gallium containing material has a low defect density ranging from 1E6/cm$^2$ to 1E11/cm$^2$. In another embodiment, the second epitaxial layer 45 of the second gallium containing material has a low defect density ranging from 1E8/cm$^2$ to 1E9/cm$^2$. In yet another embodiment, the second epitaxial layer 45 of the second gallium containing material has a low defect density ranging from 5E8/cm$^2$ to 1E9/cm$^2$.

Figure 12:
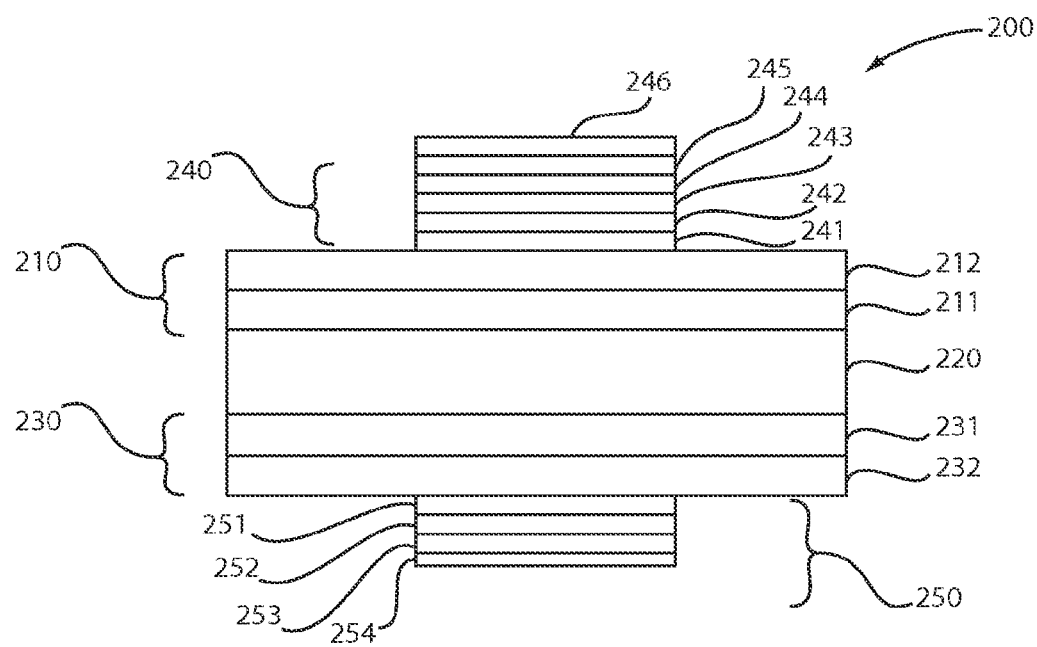
FIG. 12 depicts one embodiment of a PIN light emitting diode (LED) structure including at least one epitaxial gallium nitride layer, in accordance with the present disclosure.
Figure 13:
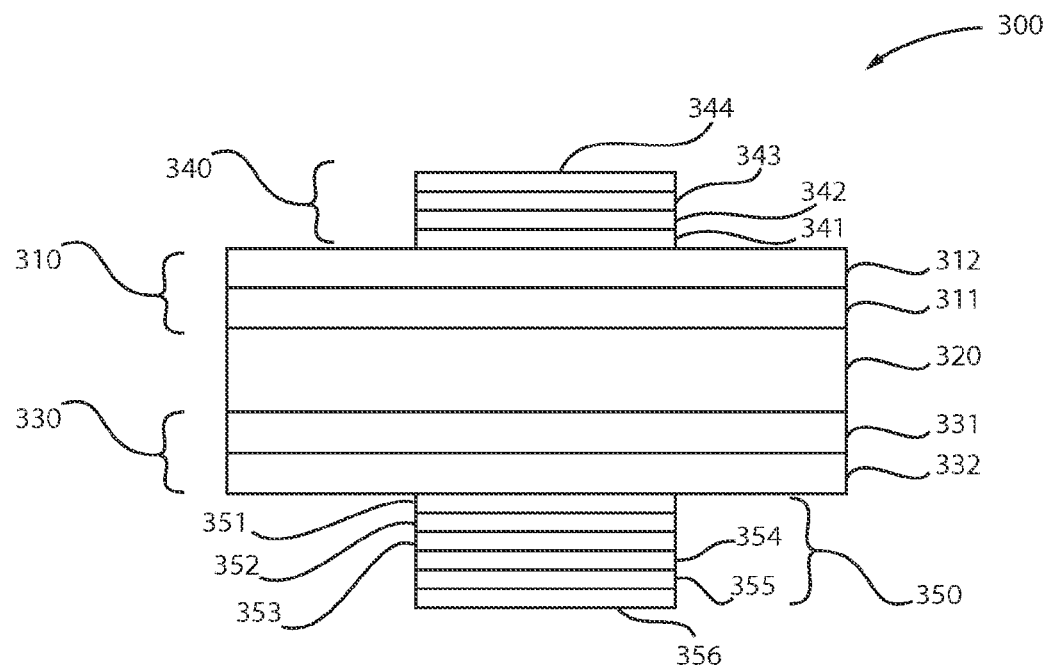
FIG. 13 depicts one embodiment of a NIP light emitting diode (LED) structure including at least one epitaxial gallium nitride layer, in accordance with the present disclosure.

FIGS. 12 and 13 depict some embodiments of semiconductor devices, e.g., LED structures, that may be formed incorporating the epitaxial gallium nitride layer 25 formed using the process flow depicted in FIGS. 1-6, and/or the second epitaxial layer 45 that is formed using the process flow depicted in FIGS. 7-11. FIG. 12 depicts one embodiment of a PIN light emitting diode (LED) structure 200. In one embodiment, the PIN light emitting diode (LED) structure 200 includes a vertical stack that is arranged to have at least one p-type conductivity semiconductor material layer 210 that is in contact with a first surface of an intrinsic semiconductor material layer 220, wherein at least one n-type conductivity semiconductor material layer 230 is present on a second surface of the intrinsic semiconductor material layer 220 that is opposite the first surface of the intrinsic semiconductor material 220. By "intrinsic" it is meant that the semiconductor material of the intrinsic semiconductor material layer 220 is undoped, i.e., does not contain n-type or p-type dopants, or contains a dopant concentration, i.e., dopant concentration of n-type or p-type dopants, of less than $1 \times 10^{17}$ atoms/cm$^3$.

In one embodiment, the at least one p-type conductivity semiconductor material layer 210 includes a p-type aluminum gallium nitride layer (($Al_xGa_{(1-x)}$N) 211 that is in direct contact with the intrinsic semiconductor material layer 220, and a p-type gallium nitride layer (GaN) 212 that is in direct contact with the p-type aluminum gallium nitride layer ((($Al_xGa_{(1-x)}$N) 211. In some embodiments, at least one of the p-type aluminum gallium nitride layer (($Al_xGa_{(1-x)}$N) 211 and the p-type gallium nitride layer (GaN) 212 may be provided by the epitaxial gallium nitride layer 25 and/or the buffer layer 20 that is formed using the process flow depicted in FIGS. 1-6, and/or the first epitaxial layer 35 and the second epitaxial layer 45 that are formed using the process flow depicted in FIGS. 7-11. For example, the p-type aluminum gallium nitride layer ((($Al_xGa_{(1-x)}$N) 211 may be provided by the buffer layer 20 that is described with reference to FIGS. 1-6, and the gallium nitride layer (GaN) 212 may be provided by the epitaxial gallium nitride layer 25 that is depicted in FIGS. 1-6. In another example, the p-type aluminum gallium nitride layer ((($Al_xGa_{(1-x)}$N) 211 may be provided by first epitaxial layer 35 formed using the process flow depicted in FIGS. 7-11, and the gallium nitride layer (GaN) 212 may be provided by the second epitaxial layer 45 formed using the process flow depicted in FIGS. 7-11. Typically, the metal containing monolayer 10 and device substrate 40 that are depicted in FIGS. 7-11 may be removed using a selective etch during the formation of the devices depicted in FIGS. 12 and 13. The p-type aluminum gallium nitride layer (($Al_xGa_{(1-x)}$N) 211 may have a thickness ranging from 10 nm to 100 nm, and the p-type gallium nitride layer (GaN) 212 may have a thickness ranging from 100 nm to 1000 nm. In one embodiments, the p-type aluminum gallium nitride layer (($Al_xGa_{(1-x)}$N) 211 and the p-type gallium nitride layer (GaN) 212 may be transferred and bonded to the intrinsic semiconductor material layer 220.

The intrinsic semiconductor material layer 220 may be composed of a type III-nitride semiconductor material. For example, the intrinsic semiconductor material layer 220 may be composed of aluminum gallium indium nitride ($Al_xGa_yIn_{(1-x-y)}$N). In another embodiment, the intrinsic semiconductor material layer 20 is a multilayered stack including layers of InGaN and GaN multi-quantum-wells. These examples are provided for illustrative purposes only, and are not intended to limit the present disclosure. For example, the intrinsic semiconductor material layer 20 may be composed of any of the type III-nitride semiconductor materials that have been described above for the buffer layer 20 and/or any of the type III-nitride materials that have been described above for the first epitaxial layer 35 and the second epitaxial layer 45. The total intrinsic semiconductor material layer may have a thickness ranging from 10 nm to 500 nm. The intrinsic semiconductor material may be formed using a chemical vapor deposition process, such as MOCVD, onto a structure including at least one p-type conductivity semiconductor material layer 210 and/or at least one n-type conductivity semiconductor material layer 230. In another embodiment, the intrinsic semiconductor material may be transferred and bonded onto a structure including at least one p-type conductivity semiconductor material layer 210 and/or at least one n-type conductivity semiconductor material layer 230.

In one embodiment, the at least one n-type conductivity semiconductor material layer 230 includes an n-type aluminum gallium nitride layer (($Al_xGa_{(1-x)}$N) 231 that is in direct contact with the instinsic semiconductor material layer 220, and an n-type allium nitride layer (GaN) 232 that is in direct contact with the n-type aluminum gallium nitride layer ((($Al_xGa_{(1-x)}$N) 231. In some embodiments, at least one of the n-type aluminum gallium nitride layer (($Al_xGa_{(1-x)}$N) 231 and the n-type gallium nitride layer (GaN) 232 may be provided by the epitaxial gallium nitride layer 25 and/or the buffer layer 20 that is formed using the process flow depicted in FIGS. 1-6, and/or the first epitaxial layer 35 and the second epitaxial layer 45 that are formed using the process flow depicted in FIGS. 7-11. For example, the n-type aluminum gallium nitride layer ((($Al_xGa_{(1-x)}$N) 231 may be provided by the buffer layer 20 that is described with reference to FIGS. 1-6, and the n-type gallium nitride layer (GaN) 232 may be provided by the epitaxial gallium nitride layer 25 that is depicted in FIGS. 1-6, or the first epitaxial layer 35 and the second epitaxial layer 45 that are depicted in FIGS. 7-11. The n-type aluminum gallium nitride layer (($Al_xGa_{(1-x)}$N) 231 may have a thickness ranging from 10 nm to 200 nm, and the n-type gallium nitride layer (GaN) 232 may have a thickness ranging from 100 nm to 5000 nm.

In one embodiments, the n-type aluminum gallium nitride layer (($Al_xGa_{(1-x)}N$)) 231 and the n-type gallium nitride layer (GaN) 232 may be transferred and bonded to the intrinsic semiconductor material layer 220.

In the embodiment depicted in FIG. 12, contacts to the at least one p-type conductivity semiconductor material layer 210 and/or the at least one n-type conductivity semiconductor material layer 230 are formed on opposing sides of the PIN LED structure 200. This provides an LED device having a top and bottom contact allocation. In some embodiments, prior to the formation of the contacts, a passivation layer, e.g., silicon dioxide, is formed on the LED structure and is then patterned and etched to expose the portions of the LED structure in which the contacts are formed.

In one embodiment, a first contact 240 is present on and in electrical communication with the at least one p-type conductivity semiconductor material layer 210 and a second contact 250 is present on and in electrical communication with the at least one n-type conductivity semiconductor material layer 230. In one embodiment, the first contact 240 is composed of a multilayered stack of a nickel layer 241 that is in direct contact with the p-type gallium nitride layer (GaN) 212, a gold layer 242, a titanium layer 243, a silver layer 244, a titanium layer 245 and a gold layer 246. In one embodiment, a second contact 250 includes a multilayered stack of a titanium layer 251 that is contact with the n-type gallium nitride layer (GaN) 232, a silver layer 252, and a titanium layer 253, and a gold layer 254. In some embodiments, the silver layer identified by reference number 244 in the first contact 240, and the silver layer identified by reference number 252 may be omitted.

In one embodiment, the first contact 240 and the second contact 250 may be formed using deposition, photolithography and etch processes. For example, each layer of the first contact 240 and the second contact 250 may be deposited using a physical vapor deposition (PVD) process, such as plating and sputtering. The deposited layers for the first contact 240 may be patterned and etched so that only a portion of the at least one p-type conductivity semiconductor material layer 210 is covered by the first contact 240. The deposited layers for the second contact 250 may be patterned and etched so that only a portion of the at least one n-type conductivity semiconductor material layer 230 is covered by the second contact 250.

The PIN LED structure 200 depicted in FIG. 12 includes at least one stepped surface that results from cleaving a type III-nitride material from the graphene layer 10, as provided by the layer transfer/cleaving methods that are depicted in FIGS. 1-11. The stepped surface may be present on any surface of a type III-nitride semiconductor material that is cleaved from a graphene layer, which may be at least one of the p-type aluminum gallium nitride layer ((($Al_xGa_{(1-x)}N$)) 211, the p-type gallium nitride layer (GaN) 212, the intrinsic semiconductor material layer 220, the n-type aluminum gallium nitride layer (($Al_xGa_{(1-x)}N$)) 231, and the n-type gallium nitride layer (GaN) 232.

FIG. 13 depicts one embodiment of a NIP light emitting diode (LED) structure 300. The NIP light emitting diode (LED) that is depicted in FIG. 13 is similar to PIN LED 200 depicted in FIG. 12. The NIP LED 300 includes a vertical stack that is arranged to have at least one n-type conductivity semiconductor material layer 310 that is in contact with a first surface of an intrinsic semiconductor material layer 320, wherein at least one p-type conductivity semiconductor material layer 330 is present on a second surface of the intrinsic semiconductor material layer 320 that is opposite the first surface of the intrinsic semiconductor material 320.

In one embodiment, the at least one n-type conductivity semiconductor material layer 310 includes an n-type aluminum gallium nitride layer (($Al_xGa_{(1-x)}N$)) 311 that is in direct contact with the instinsic semiconductor material layer 320, and a n-type gallium nitride layer (GaN) 312 that is in direct contact with the n-type aluminum gallium nitride layer ((($Al_xGa_{(1-x)}N$)) 311. In some embodiments, at least one of the n-type aluminum gallium nitride layer (($Al_xGa_{(1-x)}N$)) 311 and the n-type gallium nitride layer (GaN) 312 may be provided by the epitaxial gallium nitride layer 25 and/or the buffer layer 20 that is formed using the process flow depicted in FIGS. 1-6, and/or the first epitaxial layer 35 and the second epitaxial layer 45 that are formed using the process flow depicted in FIGS. 7-11.

The intrinsic semiconductor material layer 320 may be composed of a type III-nitride semiconductor material. The above description of the intrinsic semiconductor material layer 220 that is depicted in FIG. 12 is suitable for the intrinsic semiconductor material layer 320 that is depicted in FIG. 13.

In one embodiment, the at least one p-type conductivity semiconductor material layer 330 includes an p-type aluminum gallium nitride layer (($Al_xGa_{(1-x)}N$)) 331 that is in direct contact with the instinsic semiconductor material layer 320, and a p-type allium nitride layer (GaN) 332 that is in direct contact with the p-type aluminum gallium nitride layer ((($Al_xGa_{(1-x)}N$)) 311. In some embodiments, at least one of the p-type aluminum gallium nitride layer (($Al_xGa_{(1-x)}N$)) 331 and the p-type gallium nitride layer (GaN) 332 may be provided by the epitaxial gallium nitride layer 25 and/or the buffer layer 20 that is formed using the process flow depicted in FIGS. 1-6, and/or the first epitaxial layer 35 and the second epitaxial layer 45 that are formed using the process flow depicted in FIGS. 7-11.

In the embodiment depicted in FIG. 13, contacts to the at least one n-type conductivity semiconductor material layer 310 and/or at least one p-type conductivity semiconductor material layer 330 are formed on opposing sides of the NIP LED structure 300. This provides an NIP LED device having a top and bottom contact allocation.

In one embodiment, a first contact 340 is present on and in electrical communication with the at least one n-type conductivity semiconductor material layer 310. In one embodiment, the second contact 340 is composed of a multilayered stack of titanium layer 341 that is contact with the n-type gallium nitride layer (GaN) 312, a silver layer 342, a titanium layer 343, and a gold layer 344. A second contact 350 is present on and in electrical communication with the at least one p-type conductivity semiconductor material layer 330. In one embodiment, the second contact 350 is composed of a multilayered stack of a gold layer 351 that is contact with the p-type gallium nitride layer (GaN) 332, a titanium layer 352, a silver layer 353, a titanium layer 354, a gold layer 355 and a nickel layer 356. The first and second contacts 340, 350 depicted in FIG. 12 may be formed using similar methods for forming the first and second contacts 240, 250 depicted in FIG. 13.

The NIP LED structure 300 depicted in FIG. 13 includes at least one stepped surface that results from cleaving a type III-nitride material from the graphene layer 10, as provided by the layer transfer/cleaving method that is depicted in FIGS. 1-11. The stepped surface may be present on any surface of a type III-nitride semiconductor material that is cleaved from a graphene layer, which may be at least one of the n-type aluminum gallium nitride layer ((($Al_xGa_{(1-x)}N$)) 311, the n-type gallium nitride layer (GaN) 312, the intrinsic semiconductor material layer 320, the p-type aluminum gallium nitride layer ((Al$_x$Ga$_{(1-x)}$N) 331, and the p-type gallium nitride layer (GaN) 332.

The PIN LED structure 200 depicted in FIG. 12 and the NIP LED structure depicted in FIG. 13 may also include transparent conductive oxide (TCO) layers.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A method of forming a semiconductor material comprising:
    forming a graphene layer on a semiconductor and carbon containing substrate;
    depositing a metal containing monolayer on the graphene layer,
        wherein the metal containing monolayer is thicker than an atomic layer thickness,
        wherein the metal containing monolayer includes a plurality of adjacent aluminum layers, and
        wherein the metal containing monolayer is composed of greater than 90 percent aluminum;
    forming an epitaxial layer of a gallium containing material on the metal containing monolayer; and
    cleaving a layered stack of the metal containing monolayer and the epitaxial layer of the gallium containing material from the graphene layer that is present on the semiconductor and carbon containing substrate, wherein the cleaving of the layered stack is at an interface between the metal containing monolayer and the graphene layer.

2. The method of claim 1, wherein the semiconductor and carbon containing substrate is comprised of silicon carbide having a single crystal crystalline structure.

3. The method of claim 1, wherein the steps of depositing the metal containing monolayer and forming the epitaxial layer of the gallium containing material are conducted in a chemical vapor deposition apparatus.

4. The method of claim 3, wherein prior to depositing the metal containing monolayer, the graphene layer and the semiconductor and carbon containing substrate are heated within the chemical vapor deposition apparatus to a temperature ranging from 800° C. to 1200° C. for a time period ranging from 10 minutes to 20 minutes.

5. The method of claim 4, wherein the depositing the metal containing monolayer comprises forming an aluminum containing layer by flowing an aluminum containing source gas selected from the group consisting of trimethylaluminum (TMAl), aluminum chloride (AlCl$_3$), aluminum isopropoxide (Al(OPr)$_3$), aluminum Al(OSiEt$_3$)$_3$ and combinations thereof.

6. The method of claim 5, wherein the aluminum containing monolayer comprises two to ten adjacent monolayers of elemental aluminum.

7. The method of claim 1, wherein forming the epitaxial layer of the gallium containing material on the metal containing monolayer comprises:
    forming a buffer layer comprising at least one of gallium, aluminum, indium, nitrogen and combinations thereof; and
    forming a gallium nitride layer on the buffer layer.

8. The method of claim 7, wherein the buffer layer is at least one of gallium nitride, indium gallium nitride (In$_x$Ga$_{(1-x)}$N), aluminum gallium nitride (Al$_x$Ga$_{(1-x)}$N) and aluminum gallium indium nitride (Al$_x$Ga$_y$In$_{(1-x-y)}$N).

9. The method of claim 8, wherein the buffer layer is an epitaxially formed layer deposited at a temperature ranging from 700° C. to 1200° C.

10. The method of claim 8, wherein the gallium nitride layer is an epitaxially formed layer deposited at a temperature ranging from 900° C. to 1300° C.

11. The method of claim 1, wherein the cleaving of the layered stack of the metal containing monolayer and the epitaxial layer of gallium containing material from the graphene layer comprises:
    applying a transfer substrate to a surface of the epitaxial layer of the gallium containing material that is opposite a surface of the epitaxial layer of the gallium containing material that is in direct contact with the metal containing monolayer; and
    applying a mechanical force to the transfer substrate in a direction away from an interface between the metal containing monolayer and the graphene layer.

12. A method for forming at least one semiconductor layer comprising:
    forming at least one first epitaxial layer of at least one first gallium containing material on a graphene layer that is present on a semiconductor and carbon containing substrate, wherein the at least one first epitaxial layer of at least one first gallium containing material includes a metal containing monolayer in direct contact with the graphene layer,
        wherein the metal containing monolayer is composed of greater than 90 percent aluminum;
        wherein the metal containing monolayer is thicker than an atomic layer thickness, and
        wherein the metal containing monolayer includes a plurality of adjacent aluminum layers;
    bonding a transfer substrate to a surface of the at least one first epitaxial layer of the at least one first gallium containing material that is opposite a surface of the at least one first epitaxial layer of the at least one first gallium containing material that present on the semiconductor and carbon containing substrate;
    applying a mechanical force to the transfer substrate in a direction away from the graphene layer to cleave the at least one first epitaxial layer of the at least one first gallium containing material from a stack of the graphene layer and the semiconductor and carbon containing substrate, wherein the cleaving of the at least one first epitaxial layer of the at least one first gallium containing material is at an interface between the metal containing monolayer and the graphene layer;
    removing the transfer substrate from the at least one first epitaxial layer of the first gallium containing material;
    bonding a device substrate to the at least one first epitaxial layer of the first gallium containing material; and
    forming a second epitaxial layer of a second gallium containing material on the at least one first epitaxial layer of the at least one first gallium containing material.

13. The method of claim 12, wherein the second epitaxial layer of the second epitaxial material has a defect density of 2E9/cm$^2$ or less.

14. The method of claim 12, wherein the semiconductor and carbon containing substrate comprises silicon carbide or silicon.

15. The method of claim 12, wherein the at least one first epitaxial layer is a multilayered structure including a buffer layer composed of at least one of gallium nitride, indium gallium nitride ($In_xGa_{(1-x)}N$), aluminum gallium nitride ($Al_xGa_{(1-x)}N$) and aluminum gallium indium nitride ($Al_xGa_yIn_{(1-x-y)}N$), and an epitaxial gallium nitride layer, wherein the epitaxial gallium nitride layer provides an upper surface of the at least one first epitaxial layer.

16. The method of claim 12, wherein device substrate is a material selected from the group consisting of sapphire, silicon, silicon carbide and combinations thereof.

17. The method of claim 12, wherein the second gallium containing material is gallium nitride.

18. The method of claim 12, wherein the at least one first epitaxial layer of at least one first gallium containing material is in a strained state on the graphene layer and the semiconductor and carbon containing substrate, wherein the at least one first epitaxial layer is relaxed after the removing of the transfer substrate.

19. A method of forming a semiconductor material comprising:

forming a graphene layer on a semiconductor and carbon containing substrate;
depositing a metal containing monolayer on the graphene layer,
wherein the metal containing monolayer is thicker than an atomic layer thickness;
forming an epitaxial layer of a gallium containing material on the metal containing monolayer; and
cleaving a layered stack of the metal containing monolayer and the epitaxial layer of the gallium containing material from the graphene layer that is present on the semiconductor and carbon containing substrate, wherein the cleaving of the layered stack is at an interface between the metal containing monolayer and the graphene layer.

20. The method of claim 19, wherein the metal containing monolayer includes a plurality of adjacent metal layers.

* * * * *